US008470400B2

(12) United States Patent
Colombo et al.

(10) Patent No.: US 8,470,400 B2
(45) Date of Patent: Jun. 25, 2013

(54) GRAPHENE SYNTHESIS BY CHEMICAL VAPOR DEPOSITION

(75) Inventors: Luigi Colombo, Dallas, TX (US); Xuesong Li, Austin, TX (US); Rodney S. Ruoff, Austin, TX (US)

(73) Assignees: Board of Regents, The University of Texas System, Austin, TX (US); Texas Instruments, Inc., Dallas, TX (US)

( * ) Notice: Subject to any disclaimer, the term of this patent is extended or adjusted under 35 U.S.C. 154(b) by 339 days.

(21) Appl. No.: 12/774,342

(22) Filed: May 5, 2010

(65) Prior Publication Data

US 2011/0091647 A1 Apr. 21, 2011

Related U.S. Application Data

(60) Provisional application No. 61/253,616, filed on Oct. 21, 2009.

(51) Int. Cl.
*C23C 16/00* (2006.01)

(52) U.S. Cl.
USPC ............... 427/249.1; 427/248.1; 427/249.6

(58) Field of Classification Search
USPC ...................................... 427/249.1
See application file for complete search history.

(56) References Cited

U.S. PATENT DOCUMENTS

| 2007/0092432 | A1 | 4/2007 | Prud'Homme et al. |
| 2007/0163702 | A1 | 7/2007 | Sullivan |
| 2008/0306225 | A1 | 12/2008 | Prud'Homme et al. |
| 2009/0028777 | A1 | 1/2009 | Zhamu et al. |
| 2009/0047520 | A1* | 2/2009 | Lee et al. ............... 428/408 |
| 2009/0110627 | A1* | 4/2009 | Choi et al. ............. 423/447.1 |
| 2009/0155561 | A1 | 6/2009 | Choi et al. |
| 2009/0324897 | A1 | 12/2009 | Choi et al. |

OTHER PUBLICATIONS

Obraztsov et. al. "Chemical vapor deposition of thin graphite films of nanometer thickness" carbon 45 (Jun. 24, 2007) p. 2017-2021.*
Li et. al. "Supporting Online Material for Large Area Synthesis of High Quality and Uniform Graphene Films on Copper Foils" Science Express, May 7, 2009.*
Loginova et. al. "Evidence for graphene growth by C cluster attachment" New Journal of Physics 10, Sep. 25, 2008 p. 1-16.*
Kim et. al. "Large scale pattern growth of graphene films for stretchable transparent electrodes" Nature vol. 457, Feb. 5, 2009. p. 706-710.*
Patel, Prachi, "How to Make Graphene," Apr. 14, 2008, http://www.technologyreview.com/computing/20558/?a=f.

(Continued)

*Primary Examiner* — Timothy Meeks
*Assistant Examiner* — Mandy Louie
(74) *Attorney, Agent, or Firm* — Robert A. Voigt, Jr.; Winstead, P.C.

(57) ABSTRACT

Processes for synthesizing graphene films. Graphene films may be synthesized by heating a metal or a dielectric on a substrate to a temperature between 400° C. and 1,400° C. The metal or dielectric is exposed to an organic compound thereby growing graphene from the organic compound on the metal or dielectric. The metal or dielectric is later cooled to room temperature. As a result of the above process, standalone graphene films may be synthesized with properties equivalent to exfoliated graphene from natural graphite that is scalable to size far greater than that available on silicon carbide, single crystal silicon substrates or from natural graphite.

15 Claims, 5 Drawing Sheets

OTHER PUBLICATIONS

Brindley, Lewis, "Graphene Sheets with Less Flap," Jan. 28, 2008, http://www.rsc.org/chemistryworld/News/2008/January/28010802.asp.

Li, Xuesong et al., "Large-Area Synthesis of High-Quality and Uniform Graphene Films on Copper Foils," Science, Jun. 5, 2009, vol. 324, pp. 1312-1314; published online May 7, 2009.

Li, Xuesong et al., "Evolution of Graphene Growth on Ni and Cu by Carbon Isotope Labeling," Nano Letters, Aug. 27, 2009, pp. 4268-4272.

Li, Xuesong et al., "Transfer of Large-Area Graphene Films for High-Performance Transparent Conductive Electrodes," Nano Letters, Oct. 21, 2009, pp. 4359-4363.

Karu et al., "Pyrolytic Formation of Highly Crystalline Graphite Films," J. Appl. Phys. 37, 2179-2181 (1966).

* cited by examiner

GRAPHENE SYNTHESIS BY CHEMICAL VAPOR DEPOSITION

CROSS-REFERENCE TO RELATED APPLICATIONS

This application is related to the following commonly owned co-pending U.S. patent application:

Provisional Application Ser. No. 61/253,616, "Synthesizing Graphene With Improved Conductivity Due to Increasing Domain Size and Reducing Domain Boundaries," filed Oct. 21, 2009, and claims the benefit of its earlier filing date under 35 U.S.C. §119(e).

TECHNICAL FIELD

The present invention relates to making graphene, and more particularly to synthesizing graphene films with improved conductivity by controlling the graphene domain size and decreasing the density of the domain boundaries.

BACKGROUND OF THE INVENTION

Graphene is a one-atom-thick planar sheet of $sp^2$-bonded carbon atoms that are densely packed in a honeycomb crystal lattice. The carbon-carbon bond length in graphene is about 0.142 nm. Graphene is the basic structural element of some carbon allotropes including graphite, carbon nanotubes and fullerenes.

Currently, large graphene "single crystal" films can be produced by mechanical exfoliation (repeated peeling) of graphite crystals. However, graphene produced by this method is of very limited size (e.g., at most a few hundred micrometers on the side), very expensive, not scalable, and very difficult and impractical to implement in an industrial environment.

Another method for producing graphene is to heat silicon carbide to high temperatures (e.g., much greater than 1,400° C.) to evolve silicon atoms preferentially from the silicon carbide surface to form a few layers of graphene. The layers of graphene in this case are crystallographically rotated with respect to each other such that the top layer behaves electrically as graphene rather than graphite. This process produces a sample size that is dependent upon the size of the silicon carbide substrate used. Furthermore, the quality of the graphene produced from this process degrades at the crystallographic step edges. The face of the silicon carbide used for graphene creation highly influences the thickness, mobility and carrier density of the graphene. One major disadvantage of the graphene synthesis on silicon carbide process is that even if it were scalable to large diameter crystals, it is not possible to use it for applications other than just on silicon carbide. There are many situations where graphene needs to be integrated with other applications, such as silicon integrated circuits, transparent conductive electrodes for displays or photovoltaic devices, membranes, etc.

Therefore, there is a need in the art for the synthesis of standalone graphene films with properties equivalent to exfoliated graphene from natural graphite that is scalable to size far greater than that available on silicon carbide, single crystal silicon substrates or from natural graphite.

BRIEF SUMMARY OF THE INVENTION

In one embodiment of the present invention, a method for synthesizing graphene films comprises heating either a metal or a dielectric on a substrate to a temperature between 400° C. and 1,400° C. The method further comprises exposing the metal or dielectric to an organic compound thereby growing graphene from the organic compound on the metal or dielectric. In addition, the method comprises cooling the metal or dielectric to room temperature.

In another embodiment of the present invention, a method for synthesizing graphene films comprises loading a metal or a dielectric onto a substrate into a tube furnace or a cold wall chamber. The method further comprises introducing hydrogen gas at a rate between 1 to 100 sccm into the tube furnace or cold wall chamber. Furthermore, the method comprises heating the substrate to a temperature between 400° C. and 1,400° C. Additionally, the method comprises maintaining the temperature of the substrate to between 400° C. and 1,400° C. for a duration of time between 0.1 to 60 minutes while the hydrogen gas is flowing into the tube furnace or cold wall chamber. In addition, the method comprises introducing methane into the tube furnace or cold wall chamber at a flow rate between 1 to 5,000 sccm at between 10 mTorr to 780 Torr of pressure while reducing the flow rate of hydrogen gas to less than 10 sccm. Furthermore, the method comprises growing graphene from the methane on the metal or dielectric over a period of time between 0.001 to 10 minutes following the introduction of the methane.

In another embodiment of the present invention, a method for synthesizing graphene films comprises loading a metal or a dielectric onto a substrate into a tube furnace or a cold wall chamber. The method further comprises introducing hydrogen gas at a rate between 1 to 100 sccm into the tube furnace or cold wall chamber at a pressure ranging from 10 mTorr to 2 Torr. In addition, the method comprises heating the substrate to a temperature between 400° C. and 1,400° C. Furthermore, the method comprises maintaining the temperature of the substrate to between 400° C. and 1,400° C. for a duration of time between 0.1 to 60 minutes while the hydrogen gas is flowing into the tube furnace or cold wall chamber. In addition, the method comprises introducing methane into the tube furnace or cold wall chamber at a flow rate between 1 to 5,000 sccm at between 10 mTorr to 780 Ton of pressure while reducing the flow rate of hydrogen gas to less than 10 sccm thereby growing nuclei over a time period between 0.001 to 120 seconds. Additionally, the method comprises increasing the flow rate of methane by between 10 to 5,000 sccm whereby graphene is grown from methane on the metal or dielectric over a period of time between 0.01 to 600 seconds following the introduction of the methane.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWING

A better understanding of the present invention can be obtained when the following detailed description is considered in conjunction with the following drawings, in which.

DETAILED DESCRIPTION OF THE INVENTION

As discussed in the Background section, currently, large graphene crystallites can be produced by mechanical exfoliation (repeated peeling) of graphite crystals. However, graphene produced by this method is difficult to form and is not at all scalable. Another method for producing graphene is to heat silicon carbide to high temperatures (e.g., much greater than 1,400° C.) to reduce it to graphene. This process produces a sample size that is dependent upon the size of the silicon carbide substrate used. The face of the silicon carbide used for graphene creation highly influences the thickness, mobility and carrier density of the graphene. While this process is scalable, it is limited to applications where a silicon carbide substrate is part of the device. Large area graphene films required by many applications will be difficult if not impossible to fulfill using this technique. Therefore, there is a need in the art for the synthesis of standalone graphene films with properties equivalent to exfoliated graphene from natural graphite that is scalable to size far greater than that available on silicon carbide, single crystal silicon substrates or from natural graphite.

Figure 1:
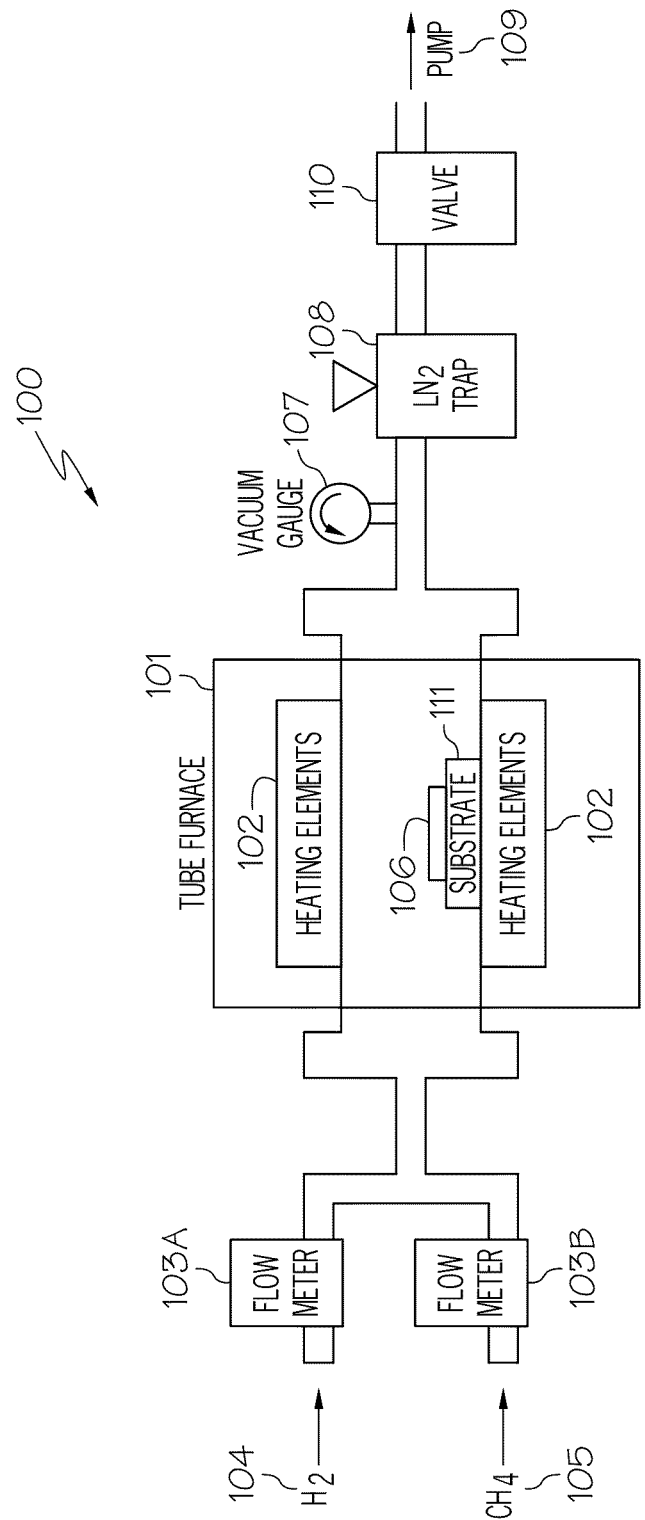
FIG. 1 illustrates an apparatus for synthesizing graphene using the processes of the present invention in accordance with an embodiment of the present invention.
Figure 2:
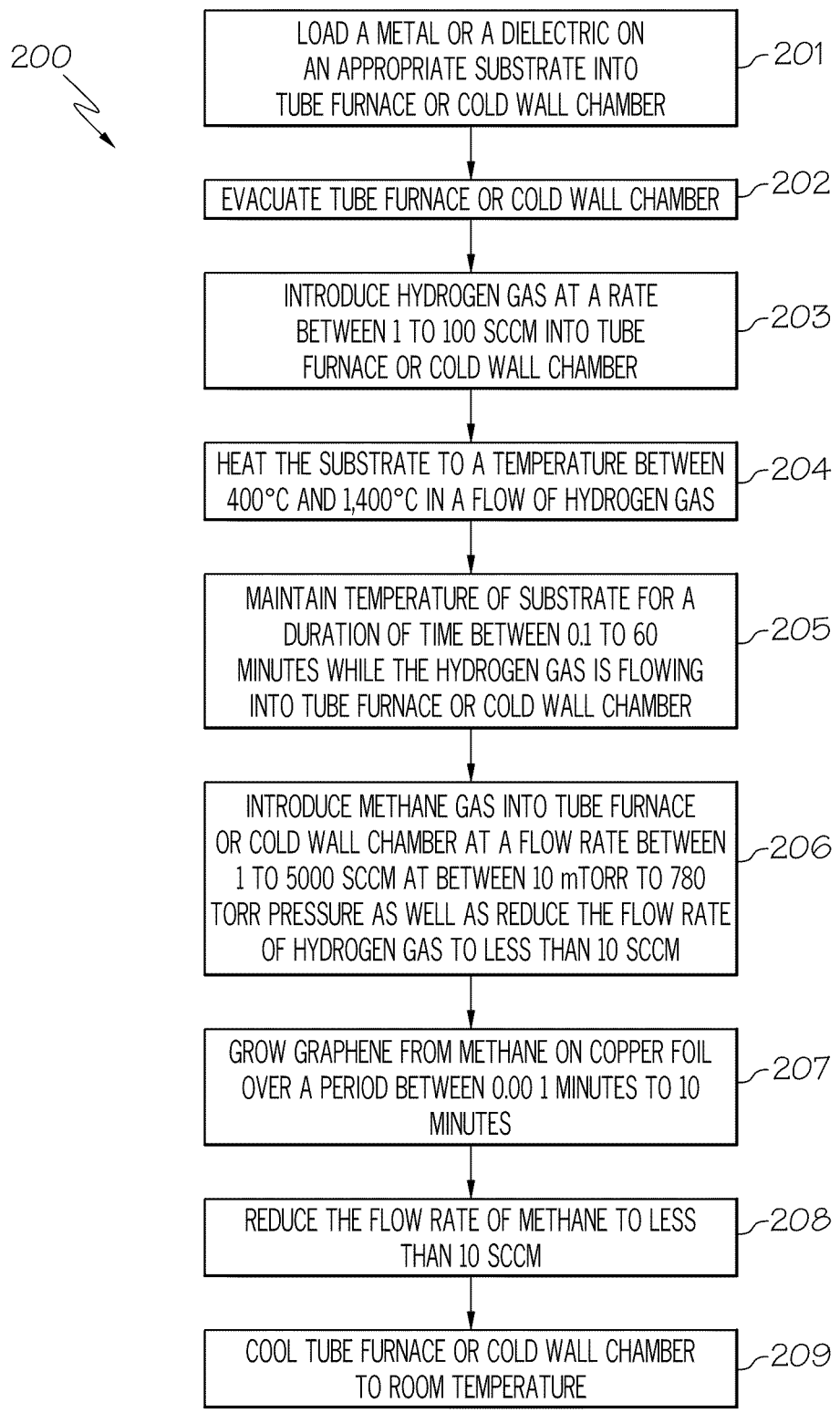
FIG. 2 is a flowchart of a method for synthesizing graphene in accordance with an embodiment of the present invention.
Figure 3:
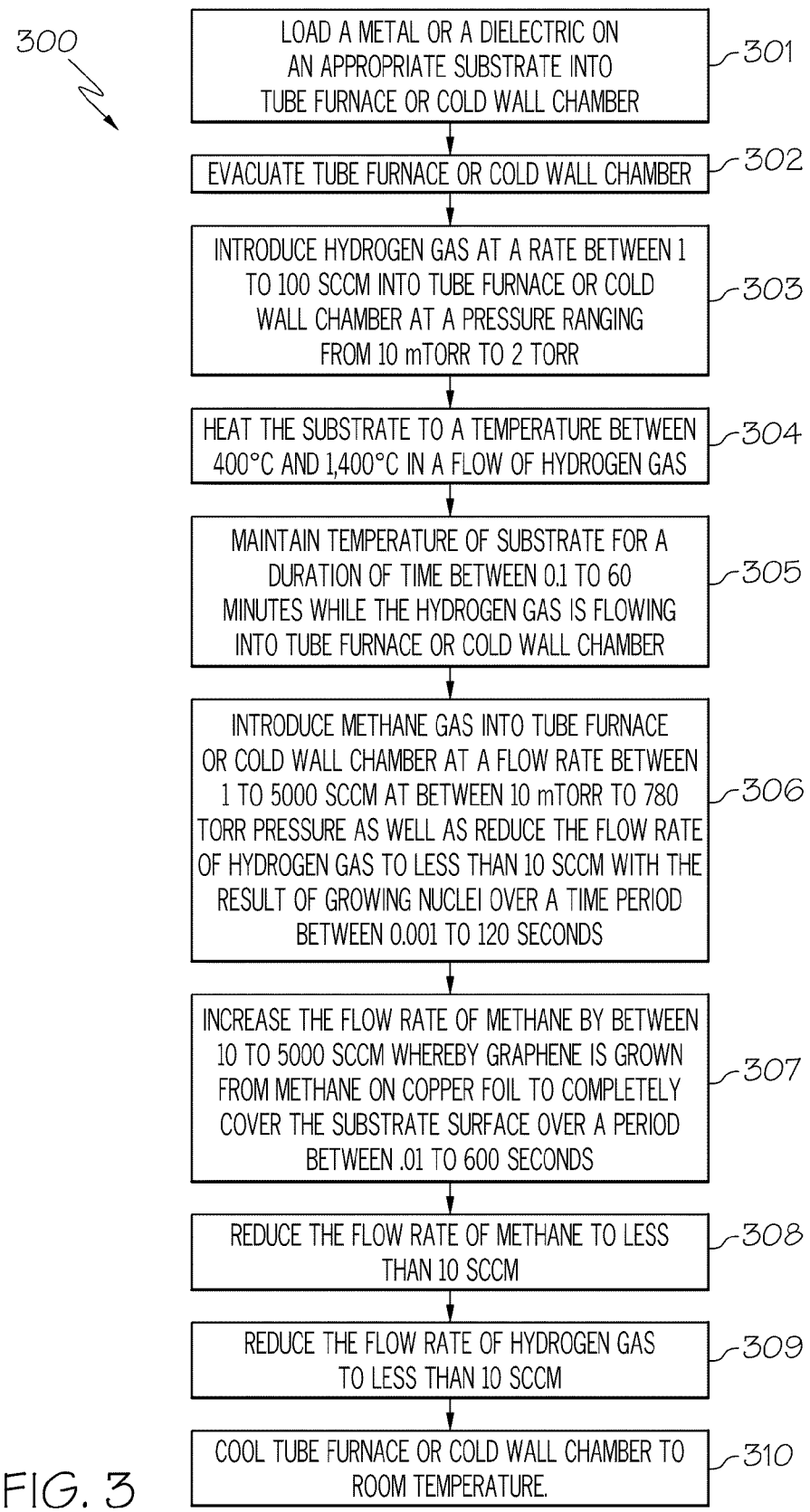
FIG. 3 is a flowchart of an alternative method for synthesizing graphene in accordance with an embodiment of the present invention.

A process for synthesizing such graphene films is discussed below in connection with FIGS. 1-3, 4A-E. FIG. 1 illustrates an apparatus for synthesizing graphene using the processes of the present invention. FIG. 2 is a flowchart of a method for synthesizing graphene. FIG. 3 is a flowchart of an alternative method for synthesizing graphene. FIGS. 4A-E illustrate the domain size of graphene grown under different growth conditions using the principles of the present invention.

Referring to FIG. 1, FIG. 1 illustrates an apparatus 100 for synthesizing graphene using the processes of the present invention in accordance with an embodiment of the present invention. Apparatus 100 includes a tube furnace 101, which is an electric heating device used to conduct synthesis of graphene. In one embodiment, tube furnace 101 consists of a cylindrical cavity surrounded by heating elements 102 (e.g., heating coils), which are embedded in a thermally insulating matrix (not shown). In one embodiment, the length of the cylindrical cavity is between 40 to 60 cm with a diameter of about 8 cm. The temperature of tube furnace 101 may be controlled via feedback from a thermocouple (not shown). The growth chamber used to grow graphene can be a furnace as described above that can be scaled to any size as required by the size of the substrate and the size of the graphene to be grown. Alternatively, a cold wall single wafer apparatus can be used to grow graphene which can be heated to an appropriate temperature to react with the reacting gas on the surface of the substrate.

Apparatus 100 may further include flow meters 103A, 103B used to measure the gas flow. For example, flow meter 103A is used to measure the flow of hydrogen ($H_2$) gas 104; whereas, flow meter 103B is used to measure the flow of methane ($CH_4$) 105. In one embodiment, large-area graphene is grown by chemical vapor deposition from a mixture of methane 105 and hydrogen gas 104 on a copper foil 106 located in tube furnace 101 as discussed in further detail below. In one embodiment, copper foil 106 may be placed on a substrate 111. In one embodiment, substrate 111 may be comprised of silicon, silicon dioxide, hafnium oxide, zirconium oxide, boron nitride or aluminum oxide.

In other embodiments, graphene may be grown using the principles of the present invention described herein using other sources of organic compounds besides methane, such as ethylene, acetylene or other similar compounds that can be a source of carbon for the growth of graphene. While the following discusses using methane to grow graphene, the principles of the present invention are not limited to solely using methane but can include the use of any organic compound that can be a source of carbon.

In other embodiments, graphene may be grown by chemical vapor deposition using a different metal than copper, such as metals or dielectrics that are catalytic and have very low carbon solubility. While the following discusses growing graphene by chemical vapor deposition from a mixture of methane and hydrogen on a copper foil, the principles of the present invention are not limited to solely using a copper foil but can include the use of other metals or alloys (e.g., copper and nickel, copper and cobalt, and copper and ruthenium) or dielectrics, such as zirconium dioxide, hafnium oxide, boron nitride and aluminum oxide, that have a very low carbon solubility.

Returning to FIG. 1, apparatus 100 may also include a vacuum gauge 107 used to measure the pressure in a vacuum. Additionally, apparatus 100 may include a trap 108 used to condense all vapors except the permanent gases into a liquid or solid. Trap 108 prevents vapors from contaminating a vacuum pump 109. In one embodiment, trap 108 uses liquid nitrogen ($LN_2$) as its coolant. Apparatus 100 additionally includes a ball valve 110 used to control the pressure.

While the present invention is discussed in connection with heating a substrate surface in a tube furnace, the principles of the present invention described herein may be implemented by heating the substrate surface using rapid thermal processing or flash annealing.

The processes using apparatus 100 for synthesizing graphene are described below in connection with FIGS. 2 and 3.

Referring to FIG. 2, FIG. 2 is a flowchart of a method 200 for synthesizing graphene in accordance with an embodiment of the present invention. Referring to FIG. 2, in conjunction FIG. 1, in step 201, a metal (e.g., foil of copper 106) or a dielectric on an appropriate substrate is loaded into tube furnace 101 or into a cold wall chamber. In one embodiment, copper foil 106 is about 2 meters wide, about 4 meters long and with a thickness ranging from about 10 nanometers to about 0.05 millimeters.

In step 202, tube furnace 101 or the cold wall chamber is evacuated.

In step 203, a rate of hydrogen gas 104 between 1 to 100 sccm is introduced into tube furnace 101 or the cold wall chamber.

In step 204, the substrate is heated to a temperature between 400° C. and 1,400° C. in a flow of hydrogen gas 104.

In step 205, the temperature of the substrate in step 204 is maintained for a duration of time between 0.1 to 60 minutes while the hydrogen gas 104 is flowing into tube furnace 101 or the cold wall chamber. Alternatively, the metal (e.g., copper) can be annealed at a higher temperature to grow grains before the graphene growth at a lower temperature as discussed below.

In step 206, methane 105 or some other organic compound is introduced into tube furnace 101 or the cold wall chamber at a flow rate between 1 to 5,000 sccm at between 10 mTorr to 780 Torr of pressure. Furthermore, in step 206, the flow rate of hydrogen gas 104 is reduced to less than 10 sccm.

In step 207, graphene is grown from methane 105 on copper foil 106 over a period between 0.001 minutes to 10 minutes.

In step 208, the flow rate of methane 105 is reduced to less than 10 sccm.

In step 209, tube furnace 101 or the cold wall chamber is cooled to room temperature.

Full substrate (e.g., copper substrate) coverage can be achieved by flowing methane 105 at a corresponding pressure so that graphene films of a domain size up to about 100 square microns can be achieved.

Method 200 may include other and/or additional steps that, for clarity, are not depicted. Further, method 200 may be executed in a different order presented and the order presented in the discussion of FIG. 2 is illustrative. Additionally, certain steps in method 200 may be executed in a substantially simultaneous manner or may be omitted.

An alternative process for synthesizing graphene using apparatus 100 (FIG. 1) is discussed below in connection with FIG. 3.

Referring to FIG. 3, FIG. 3 is a flowchart of an alternative method 300 for synthesizing graphene in accordance with an embodiment of the present invention. Referring to FIG. 3, in conjunction FIG. 1, in step 301, a metal (e.g., foil of copper 106) or a dielectric on an appropriate substrate is loaded into tube furnace 101 or into a cold wall chamber. In one embodiment, copper foil 106 is about 1 centimeter wide, about 4 centimeters long and about 0.025 millimeters thick but not limited to this size. Furthermore, the copper can also be deposited on alternative substrates such as $SiO_2/Si$ or any other appropriate dielectric.

In step 302, tube furnace 101 or the cold wall chamber is evacuated.

In step 303, a rate of hydrogen gas 104 between 1 to 100 sccm is introduced into tube furnace 101 or the cold wall chamber at a pressure ranging from 10 mTorr to 2 Torr.

In step 304, the substrate is heated to a temperature between 400° C. and 1,400° C. in a flow of hydrogen gas 104.

In step 305, the temperature of the substrate in step 304 is maintained for a duration of time between 0.1 to 60 minutes while the hydrogen gas 104 is flowing into tube furnace 101 or the cold wall chamber.

In step 306, methane 105 or some other organic compound is introduced into tube furnace 101 or the cold wall chamber at a flow rate between 1 to 5,000 sccm at between 10 mTorr to 780 Ton of pressure. Furthermore, in step 306, the flow rate of hydrogen gas 104 is reduced to less than 10 sccm. Additionally, in step 306, nuclei are grown over a time period between 0.001 to 120 seconds.

In step 307, the flow rate of methane 105 is increased by between 10 to 5,000 sccm. During this step, graphene is grown from methane 105 on copper foil 106 to completely cover the substrate surface over a period between 0.01 to 600 seconds.

In step 308, the flow rate of methane 105 is reduced to less than 10 sccm.

In step 309, the flow rate of hydrogen gas 104 is reduced to less than 10 sccm.

In step 310, tube furnace 101 or the cold wall chamber is cooled to room temperature.

Low flow rates for methane 105 and a low pressure can produce large graphene domains, more than 100 square micrometers in area, while a high flow rate of methane 105 and a high pressure are preferred for complete surface coverage. As a result, by changing the flow rate of methane 105 from low to high, with a concurrent increase in pressure, large domain graphene films can be grown. These films will have a lower domain boundary density and defects thereby resulting in better (higher) electronic conductivity.

Method 300 may include other and/or additional steps that, for clarity, are not depicted. Further, method 300 may be executed in a different order presented and the order presented in the discussion of FIG. 3 is illustrative. Additionally, certain steps in method 300 may be executed in a substantially simultaneous manner or may be omitted.

Although the method is described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

An illustration of the domain size of graphene grown under different growth conditions using the principles of the present invention as described in FIGS. 2 and 3 is provided below in connection with FIGS. 4A-E.

Referring to FIGS. 4A-E, FIG. 4A illustrates a scanning electron microscopy (SEM) image of partially grown graphene under the growth condition of 985° C. with a flow rate of methane 105 at 35 sccm under a pressure of 460 mTorr using the principles of the present invention as described in FIGS. 2 and 3.

Figure 4D:
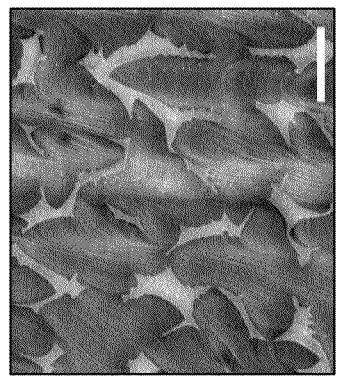
FIGS. 4A-E illustrate the domain size of graphene grown under different growth conditions using the principles of the present invention.
Figure 4C:
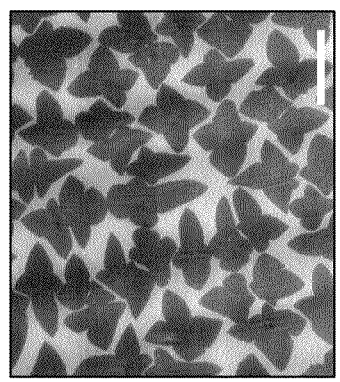
Figure 4B:
Figure 4A:
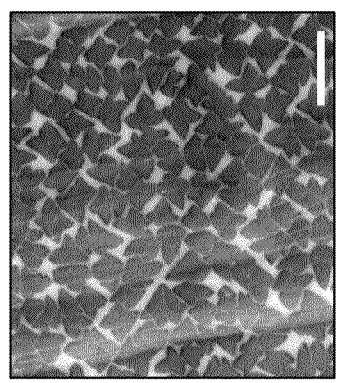

FIG. 4B illustrates an SEM image of partially grown graphene under the growth condition of 1,035° C. with a flow rate of methane 105 at 35 sccm under a pressure of 460 mTorr using the principles of the present invention as described in FIGS. 2 and 3.

FIG. 4C illustrates an SEM image of partially grown graphene under the growth condition of 1,035° C. with a flow rate of methane 105 at 7 sccm under a pressure of 460 mTorr using the principles of the present invention as described in FIGS. 2 and 3.

FIG. 4D illustrates an SEM image of partially grown graphene under the growth condition of 1,035° C. with a flow rate of methane 105 at 7 sccm under a pressure of 130 mTorr using the principles of the present invention as described in FIGS. 2 and 3.

Figure 4E:
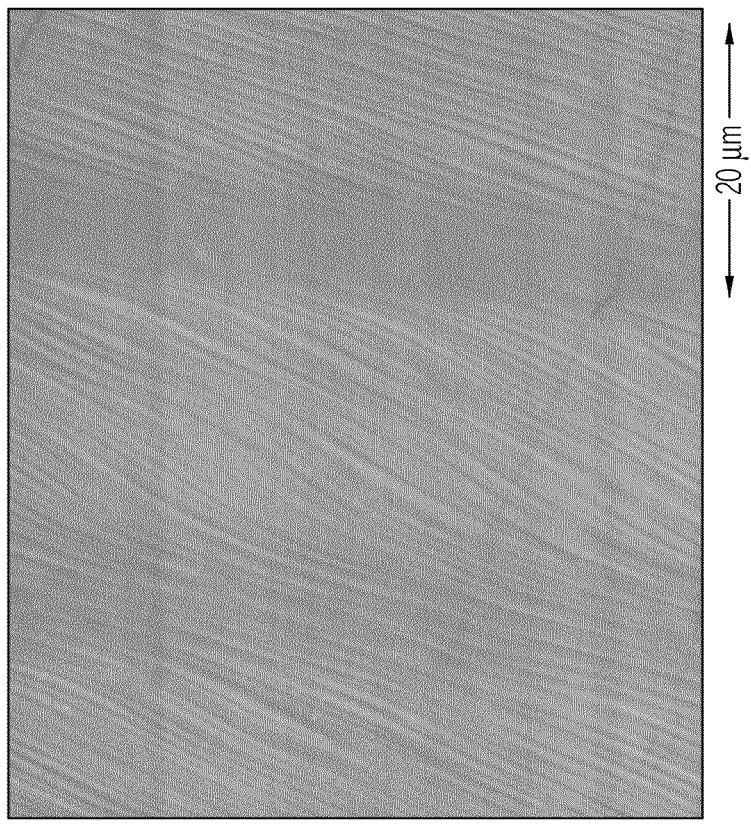

FIG. 4E illustrates an SEM image of a copper substrate being fully covered with a graphene film using the principles of the present invention as described in FIG. 3.

The invention claimed is:

1. A method for synthesizing graphene films, the method comprising:
    loading a metal or a dielectric on a substrate into a tube furnace or a cold wall chamber;
    introducing hydrogen gas into said tube furnace or said cold wall chamber;
    heating said substrate to a temperature between 400° C. and 1,400° C.;
    maintaining said temperature of said substrate to between 400° C. and 1,400° C. for a duration of time between 0.1 to 60 minutes while said hydrogen gas is flowing into said tube furnace or said cold wall chamber;
    introducing a first gas from the group consisting of methane, ethylene and acetylene into said tube furnace or said cold wall chamber while reducing a flow rate of said hydrogen gas to less than 10 sccm; and
    growing graphene from said first gas on said metal or said dielectric following said introduction of said first gas.

2. The method as recited in claim 1, wherein said first gas is methane.

3. The method as recited in claim 1, wherein said first gas is ethylene or acetylene.

4. The method as recited in claim 1, wherein said metal comprises copper.

5. The method as recited in claim 1, wherein said metal or said dielectric comprises one of the following: an alloy of copper and nickel, an alloy of copper and cobalt, and an alloy of copper and ruthenium.

6. The method as recited in claim 1, wherein said metal or said dielectric comprises one of the following: zirconium dioxide, hafnium oxide, boron nitride and aluminum oxide.

7. A method for synthesizing graphene films, the method comprising:
   loading a metal or a dielectric on a substrate into a tube furnace or a cold wall chamber;
   introducing hydrogen gas at a rate between 1 to 100 sccm into one of said tube furnace and said cold wall chamber;
   heating said substrate to a temperature between 400° C. and 1,400° C.;
   maintaining said temperature of said substrate to between 400° C. and 1,400° C. for a duration of time between 0.1 to 60 minutes while said hydrogen gas is flowing into said tube furnace or said cold wall chamber;
   introducing methane into one of said tube furnace and said cold wall chamber at a flow rate between 1 to 5,000 sccm at between 10 mTorr to 780 Torr of pressure while reducing said flow rate of hydrogen gas to less than 10 sccm; and
   growing graphene from said methane on said metal or said dielectric over a period of time between 0.001 to 10 minutes following said introduction of said methane.

8. The method as recited in claim 7 further comprising:
   reducing said flow rate of methane to less than 10 sccm following said growing of said graphene.

9. The method as recited in claim 8 further comprising:
   cooling said tube furnace or said cold wall chamber following said reduction of said flow rate of methane.

10. The method as recited in claim 7, wherein said metal comprises copper foil, wherein said copper foil is about 2 meters wide, about 4 meters long and has a thickness ranging from about 10 nanometers to about 0.05 millimeters.

11. A method for synthesizing graphene films, the method comprising:
   loading a metal or a dielectric on a substrate into a tube furnace or a cold wall chamber;
   introducing hydrogen gas at a rate between 1 to 100 sccm into one of said tube furnace and said cold wall chamber at a pressure ranging from 10 mTorr to 2 Torr;
   heating said substrate to a temperature between 400° C. and 1,400° C.;
   maintaining said temperature of said substrate to between 400° C. and 1,400° C. for a duration of time between 0.1 to 60 minutes while said hydrogen gas is flowing into said tube furnace or said cold wall chamber;
   introducing methane into one of said tube furnace and said cold wall chamber at a flow rate between 1 to 5,000 sccm at between 10 mTorr to 780 Torr of pressure while reducing said flow rate of hydrogen gas to less than 10 sccm thereby growing nuclei over a time period between 0.001 to 120 seconds;
   increasing said flow rate of methane by between 10 to 5,000 sccm whereby graphene is grown from said methane on said metal or said dielectric over a period of time between .01 to 600 seconds following said introduction of said methane.

12. The method as recited in claim 11 further comprising:
   reducing said flow rate of methane to less than 10 sccm following said growing of said graphene.

13. The method as recited in claim 12 further comprising:
   reducing said flow rate of hydrogen gas to less than 10 sccm following said growing of said graphene.

14. The method as recited in claim 13 further comprising:
   cooling one of said tube furnace and said cold wall chamber following said reduction of said flow rate of methane and said reduction of said flow rate of hydrogen gas.

15. The method as recited in claim 11, wherein said metal comprises copper foil, wherein said copper foil is about 2 meters wide, about 4 meters long and has a thickness ranging from about 10 nanometers to about 0.05 millimeters.

* * * * *